(12) United States Patent
Belluomini et al.

(10) Patent No.: US 7,598,774 B2
(45) Date of Patent: *Oct. 6, 2009

(54) REDUCED POWER CONSUMPTION LIMITED-SWITCH DYNAMIC LOGIC (LSDL) CIRCUIT

(75) Inventors: Wendy Ann Belluomini, Austin, TX (US); Aniket Mukul Saha, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/145,715

(22) Filed: Jun. 25, 2008

(65) Prior Publication Data

US 2008/0284469 A1 Nov. 20, 2008

Related U.S. Application Data

(63) Continuation of application No. 11/168,691, filed on Jun. 28, 2005, now Pat. No. 7,411,425.

(51) Int. Cl.
*H03K 19/20* (2006.01)
*H03K 19/094* (2006.01)
*H03K 3/356* (2006.01)

(52) U.S. Cl. .................. 326/121; 326/95; 327/211
(58) Field of Classification Search ............ 326/93, 326/95, 98, 112, 119, 121; 327/208–212, 327/214, 215, 224, 225
See application file for complete search history.

(56) References Cited

U.S. PATENT DOCUMENTS

| 5,796,282 | A | 8/1998 | Sprague et al. |
|---|---|---|---|
| 6,242,952 | B1 | 6/2001 | Bosshart et al. |
| 6,429,689 | B1 | 8/2002 | Allen et al. |
| 6,650,145 | B2 | 11/2003 | Ngo et al. |
| 6,791,365 | B2 | 9/2004 | Bosshart |
| 6,842,046 | B2 | 1/2005 | Tzartzanis et al. |
| 6,888,377 | B2 | 5/2005 | Ngo |
| 6,900,666 | B2 | 5/2005 | Kursun et al. |
| 6,919,739 | B2 | 7/2005 | Ngo |
| 6,956,406 | B2 * | 10/2005 | Seningen et al. ............ 326/121 |
| 6,960,939 | B2 | 11/2005 | Ngo |
| 7,109,757 | B2 | 9/2006 | Yuan et al. |
| 7,129,754 | B2 | 10/2006 | Ngo et al. |
| 7,193,446 | B2 | 3/2007 | Ngo et al. |
| 7,202,705 | B2 | 4/2007 | Ngo et al. |

(Continued)

*Primary Examiner*—Rexford N Barnie
*Assistant Examiner*—Dylan White
(74) *Attorney, Agent, or Firm*—Mitch Harris, Atty at Law, LLC; Andrew M. Harris; Libby Z. Handelsman

(57) ABSTRACT

An limited-switch dynamic logic (LSDL) circuit provides reduced power consumption by reducing clock power dissipation. By clocking LSDL gates with a clock signal having a reduced voltage swing in the evaluation phase, the LSDL gates are permitted to operate, while reducing the clock power consumption dramatically. Since clock power consumption dominates in LSDL circuits, the reduction in clock power dissipation results in a significant reduction in overall circuit power consumption. The reduced swing clock is produced at a plurality of local clock buffers by supplying the local clock buffers with an extra power supply rail that is switched onto the clock distribution lines by the local clock buffers in response to the full-swing evaluate phase clock received from the global clock distribution network by the local clock buffers.

11 Claims, 3 Drawing Sheets

U.S. PATENT DOCUMENTS

| | | |
|---|---|---|
| 7,282,960 B2 * | 10/2007 | Belluomini et al. ......... 326/121 |
| 7,411,425 B2 * | 8/2008 | Belluomini et al. ......... 326/121 |
| 2003/0110404 A1 | 6/2003 | Seningen et al. |
| 2004/0051556 A1 | 3/2004 | Shimazaki et al. |
| 2004/0051560 A1 | 3/2004 | Belluomini et al. |
| 2004/0196067 A1 | 10/2004 | Hossain et al. |

* cited by examiner

US 7,598,774 B2

REDUCED POWER CONSUMPTION LIMITED-SWITCH DYNAMIC LOGIC (LSDL) CIRCUIT

This application is a Continuation of U.S. patent application Ser. No. 11/168,691, filed on Jun. 28, 2005 now U.S. Pat. No. 7,411,425.

This invention was made with Government support under H98230-04-C-0920 IVY Grant (Zebra task4). THE GOVERNMENT HAS CERTAIN RIGHTS IN THIS INVENTION.

BACKGROUND OF THE INVENTION

1. Technical Field

The present invention relates generally to dynamic logic circuits, and more particularly to a dynamic logical circuit having reduced power consumption by reducing the swing of the logic clock.

2. Description of the Related Art

Dynamic logic circuits are well known in field of digital circuits. Dynamic logic is used to decrease device count and increase speed in large-scale circuits such as very-large-scale-integration (VLSI) circuits. Dynamic logic includes pure cascaded dynamic logic referred to as "domino" logic circuits as well as static/dynamic hybrid forms of logic such as limited-switch dynamic logic (LSDL). Dynamic logic performs evaluation and storage functions in microprocessors, memories and other digital devices.

Dynamic logic circuits operate in a two-phase manner: clock signals are used to pre-charge nodes in the circuits to known values, typically at or near one of the power supply rails. Then, when the pre-charge clock changes state, an evaluation is performed by discharging the pre-charged nodes with ladders or "trees" of transistors connected in parallel-series arrangement to the opposite power supply rail. In a typical gate, with an inverter coupling a summing node to the output and N-channel transistor ladders used to pull down the summing node from a logical high level pre-charge state, each ladder combines its inputs in a logical AND function (as all transistors in a ladder must be on for the ladder to pull down the summing node), while the parallel connected ladders are combined in a logical OR function, as any activated ladder will pull down the summing node, resulting in a logical high level at the output of the dynamic logic gate.

In certain topologies and particular gate arrangements, static logic can be combined with dynamic logic to reduce circuit size, increase speed or provide other topological benefits. One such architecture is the above-mentioned LSDL logic, which reduces circuit area below that of other competitive logic types such as domino logic, while still providing the ability to generate complementary logic outputs, via one or more static stages that receive the dynamic evaluation node as an input.

LSDL logic power consumption is dominated by clock power, in which the clock is typically consuming 70% of the total circuit power. Of that power, typically 90% is power dissipated by the final distribution nets: from the local clock buffers (LCBs) to the gates themselves.

Therefore, it would be desirable to provide a method and apparatus that reduce power consumption in LSDL logic circuits, and in particular, to reduce the power consumed by the final clock distribution nets.

SUMMARY OF THE INVENTION

The objective of reducing power consumption in an LSDL logic circuit is provided in a dynamic logic circuit clock distribution apparatus and a method of operating dynamic logic gates.

The dynamic logic gates are operated so that the clock signal is a voltage-asymmetric reduced swing version of the clock signal that controls the clocked devices in the dynamic logic gates. The voltage of the control signal during the evaluate phase of the clock signal is substantially closer to the midpoint of the power supply rail than the corresponding voltage of the clock signal, (generally at or below 75% of the power supply rail), but is substantially equal to the opposite power supply rail during the pre-charge phase of the clock signal. The asymmetric operation permits the logic gates to operate while reducing the power consumption in the clock distribution nets dramatically. The dynamic logic gates can also generally be designed without a summing node keeper circuit as in the above-incorporated patent application, since the reduced swing of the clock in the pre-charge direction will help obviate leakage, noise and charge sharing effects at the summing nodes of the dynamic logic gates. The clock distribution apparatus that operates the dynamic logic gates as described above comprises a level reducing element, generally a buffer or inverter, that receives a reduced voltage power supply input and transforms an input clock having a full voltage swing to the reduced voltage swing asymmetric clock described above.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like reference numerals indicate like components, and:

DESCRIPTION OF ILLUSTRATIVE EMBODIMENT

Figure 1:
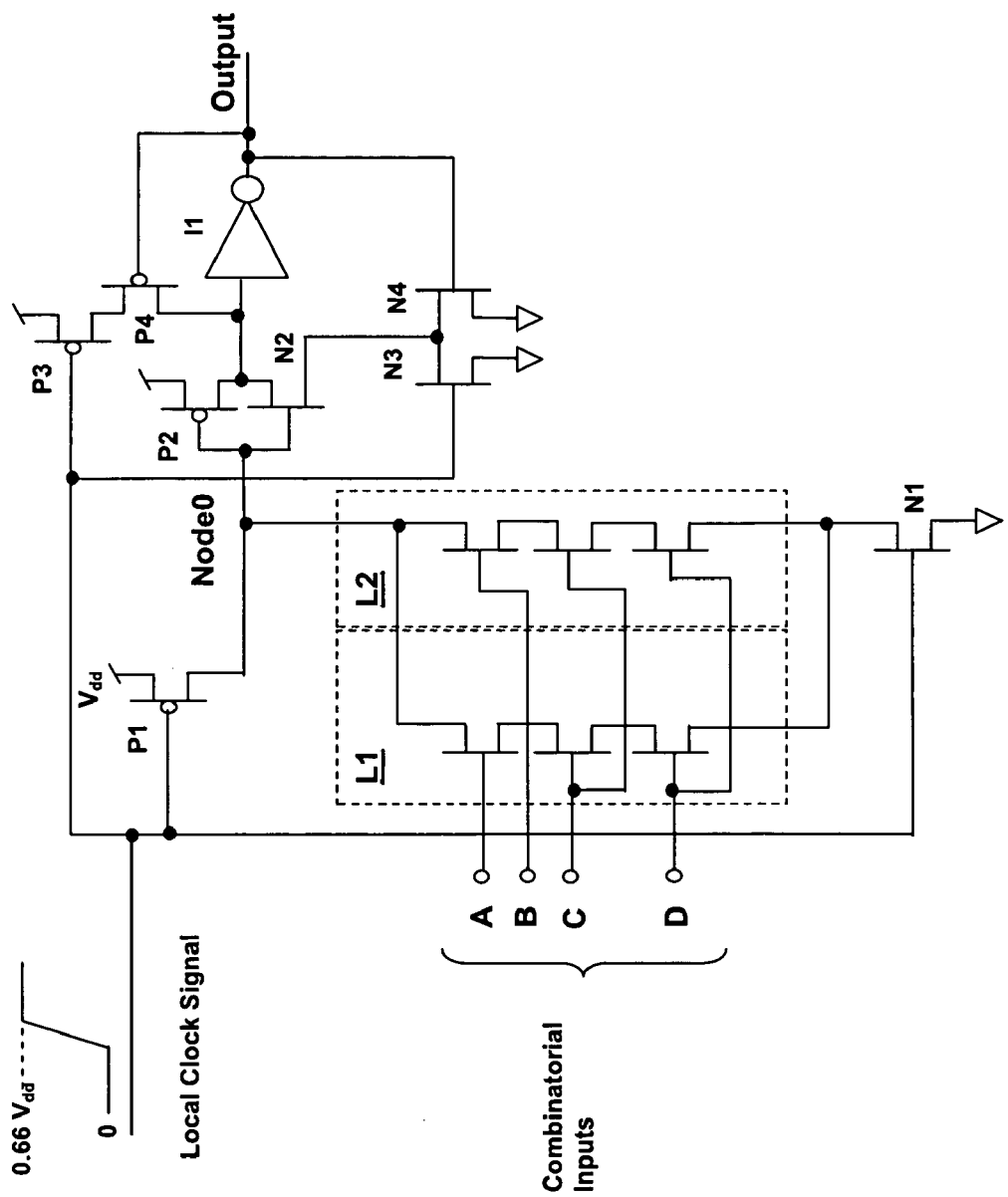
FIG. 1 is a schematic of a dynamic logic circuit in accordance with an embodiment of the invention.

The present invention concerns a mechanism for reducing power consumption in dynamic logic circuits. Since clock power consumption is the predominant portion of the total consumption in large arrays of limited-switch dynamic logic, consuming on the order of 70 percent of the total power, the clocking of the present invention is altered from prior art clocking schemes to reduce the power associated with the clock signal distribution. The energy associated with each transition of the clock signal is $CV^2/2$, where V is the change in voltage and where C is the effective capacitance and the power is directly proportional to the energy of each transition. C is the total effective capacitance on a clock line, which includes the lines themselves and all transistor gates connected to the clock signal, but is reduced somewhat from the static sum of the capacitances by the resistance of the lines. Since the clock power is proportional to the square of the clock voltage swing, any reduction in the swing voltage V can provide a dramatic improvement in power savings.

The clock voltage swing is asymmetrically reduced so that the pre-charge voltage state of the clock is the same as that of a prior art LSDL gate, but the evaluate voltage state is substantially closer to the midpoint between the power supply rails of the dynamic logic gate (generally more than 20% of the total power supply voltage away from the associated power supply rail) and may range down to being almost equal to the midpoint voltage.

In particular, in the LSDL logic gates of the present invention, it has been shown to be possible to reduce the clock swing to as little as 55% of the total power supply voltage of an LSDL gate, resulting in a theoretical savings of 75% of the clock power. Actual simulation results demonstrate a savings of 66% of the local clock power, which may generally be over 40% of the total power consumed by the dynamic logic circuits. Therefore, the present invention provides a great benefit in the operation of LSDL logic circuits. Simulation results also show an optimum clock signal swing range of 66% to 78% of the power supply voltage (at a power supply voltage of 0.9V in 65 nm technology) and an operational range down to 55% of the power supply voltage. The above ranges yield an "ideal" clock evaluate state voltage of 22-33% away from the corresponding power supply rail and an operational range of 20-45%, where the ideal range represents a tradeoff of power and operational robustness.

The present invention also provides benefits as described in the above-incorporated U.S. patent application, in which the sensitivity of a dynamic gate to noise, leakage and other factors on the input logic tree is reduced by altering the voltage swing of the signal controlling the pre-charge devices that pre-charge the summing nodes of the dynamic gates, so that the pre-charge device remains partially on during the evaluate phase. The present invention by virtue of the asymmetric clock also retains the pre-charge device in a partially conducting state.

With reference now to the figures, and in particular with reference to FIG. 1, there is depicted a schematic diagram of an LSDL gate embodying a method and an apparatus in accordance with the present invention. A dynamic portion of the dynamic logic gate is provided by ladders L1 and L2 coupled between a summing node Node0 and ground. Ladders L1 and L2 thus form an N-tree or "tree" of N-channel transistors and if either ladder L1 and L2 is activated during the evaluation phase of operation, summing node Node0 will be pulled low. A foot transistor N1 prevents shorting and/or discharging Node0 during the pre-charge phase of operation and a pre-charge transistor P1 pre-charges node Node0 to a high level. It should be understood that an a equivalent structure could be made with P-channel transistors in place of N-channel transistors and vice-versa as long as the power supply rail polarities and signal polarities are reversed. It should be noted that not all dynamic logic trees are made of independent ladders, for example, the transistors receiving input signals C and D could be merged and thus the current paths also merged, forming a more complex tree. The illustrated N-tree evaluates the equation A·C·D+B·C·D, where "+" is the logical-OR operator and "·" is the logical-AND operator. However, any combinatorial equation could be implemented by changing the N-tree and the invention encompasses all such logic.

In contrast to the above-incorporated U.S. patent application, in the present invention, pre-charge transistor P1 is clocked by the same clock signal that operates foot device N1 and other stages of the dynamic logic gate, as in prior art dynamic logic. However, in contrast to the prior art, the clock signal has a reduced swing like that described in the above-incorporated U.S. patent application. In order to achieve reduction in power consumption, the present invention reduces the swing of the entire clock signal even more dramatically, down to 50% of the total power supply rail, as illustrated in the figure. Summing node Node0 is connected to an inverter formed by transistors P2 and N2, which provides an output to another inverter I1. Inverter I1 provides the output of the dynamic logic gate, but alternatively or in concert, a complementary output can be taken from the input of inverter I1, as supplied by the inverter formed by transistors P2 and N2 in conjunction with other devices having behaviors as described in further detail below.

The inverter formed by transistors N2 and P2 is sink-disabled when both of transistors N3 and N4 are off. Transistor N3 is disabled during the pre-charge phase, which for LSDL is a short period compared to a longer evaluation phase. Therefore, the inverter formed by transistors N2 and P2 will only sink current from the input of inverter I1 if the output of inverter I1 is in a logical high state, causing that state to be held. Also during the pre-charge phase, transistor P3 is enabled, and transistor P4 which also controls the serially-connected pull-up chain formed by transistors P3 and P4, will be on if the output of inverter I1 is in a logical low state, causing that state to be held. Therefore, the pull-up chain formed by transistors P3 and P4 along with the sink portion (transistors N2-N4) of the inverter formed by transistors N2 and P2 perform a holding function, holding the value determined by the input of the inverter formed by transistors N2 and P2. The only non-hold function of the above-described circuit is provided by operation of the inverter formed by transistors N2 and P2, either through conduction of transistor P2, which can only occur when one of ladders L1, L2 has discharged summing node Node0 during an evaluation phase, or by conduction through transistor N2 during the evaluation phase when transistor N3 is enabled and summing node Node0 is in the pre-charge state. Thus the operation of transistors N2-N4 and P2-P4 is that of a static latch that latches the appropriate value at the input and output of inverter I1 after the evaluation phase has passed.

Since the clock signal is only at 66% of the power supply rail (e.g., 0.6V for a 0.9V power supply) during the evaluate state, the sizes of the evaluate transistors in logic ladders L1, L2 may have to be scaled accordingly. Also foot devices N1 and N3 may require scaling. The scaling-up of devices in logic ladders L1, L2 should have little impact as to power consumption, since they are operated at logic speeds unlike transistors N1 and N3, which are operated by the clock signal. Therefore transistors N1 and N3 must be taken into account with respect to the impact of scaling on clock power due to increased gate capacitance. Transistors P1 and P3 are unaffected with respect to any need to scale up, as the asymmetrical voltage swing of the clock signal ensures that they will be fully turned on during the pre-charge phase.

Figure 2:
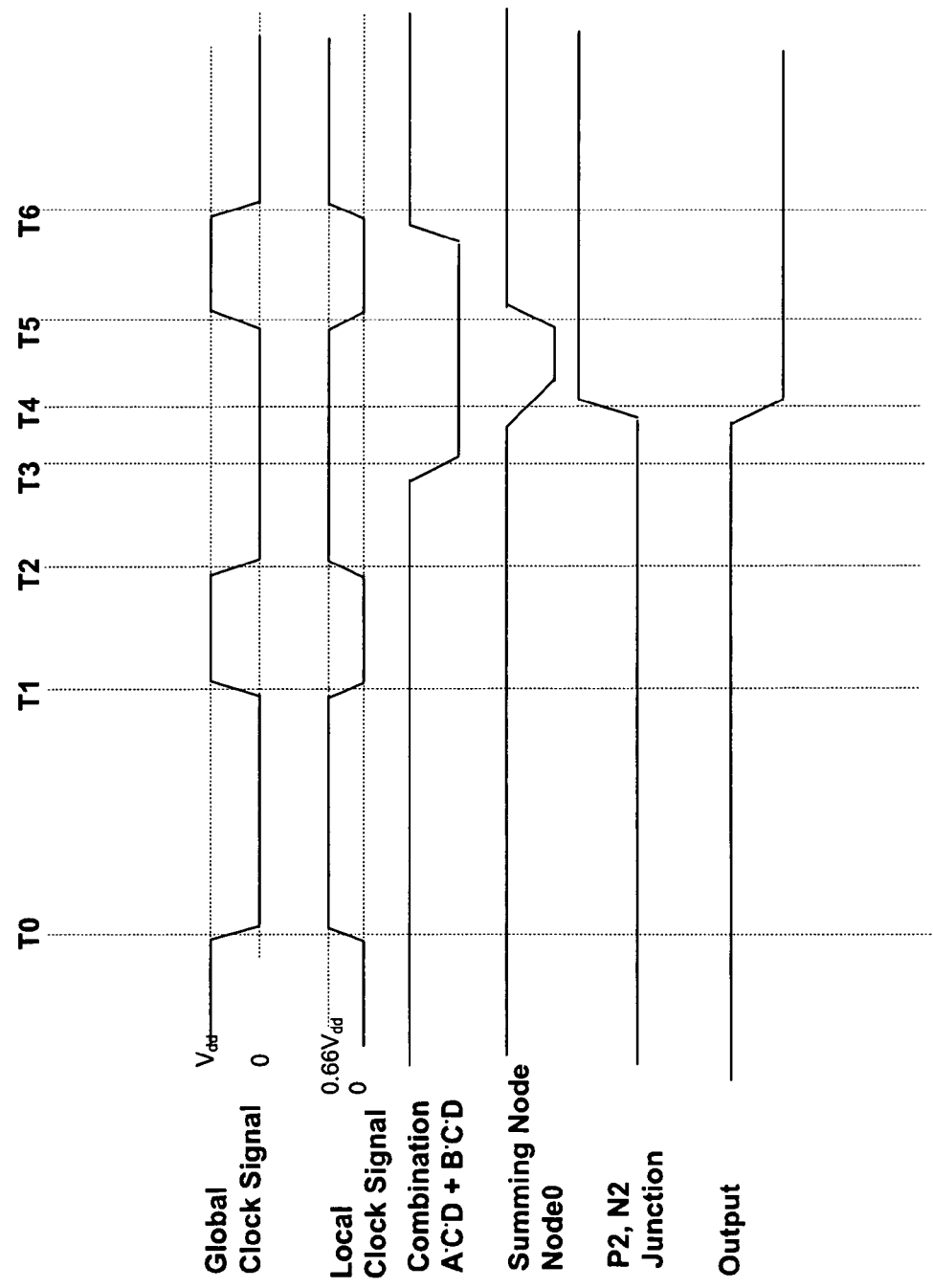
FIG. 2 is a signal diagram depicting the time-voltage relationship of signals within the dynamic logic circuit of FIG. 1.

Referring now to FIG. 2, the above-described operation is further detailed in a signal diagram depicting timing and voltage relationships of signals on various nodes of the circuit depicted in FIG. 1. At time T0 the logic gate is shown entering an evaluation phase after being in the pre-charge state. The voltage and timing relationships between the clock signal and the control signal are shown, with the control signal logic high state (pre-charge disabled) shown as 66 percent of the supply rail value as an example (0.6V at a supply voltage of 09V). During the first evaluation period shown, the logical input signal combination yields a desired output of logical "1" from the dynamic logic gate. At time T1, another pre-charge phase begins and the summing node is charged by transistor P1. At time T2, the pre-charge phase ends and another evaluation phase begins and at time T3 the input combination causes conduction of the logic tree, discharging summing node Node0 at time T4 and causing the output(s) of the dynamic logic gate to change state. At time T5 the clock and control signals enter another pre-charge phase, and P1 conducts a strong pre-charge current to quickly restore summing node Node0 to the pre-charge condition. At time T6, another evaluation phase begins.

Figure 3:
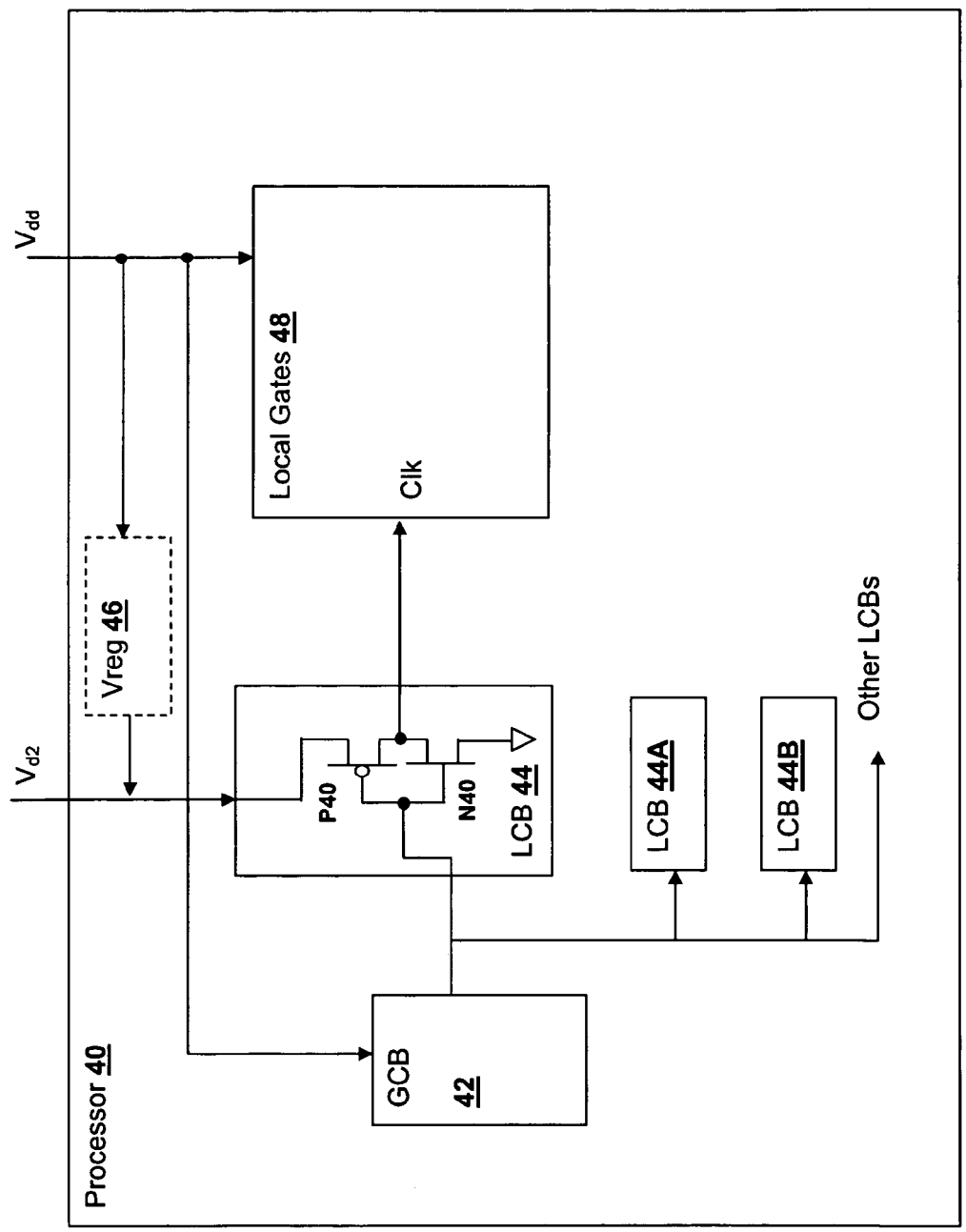
FIG. 3 is a schematic diagram depicting a specific clock signal distribution scheme in accordance with an embodiment of the present invention.

Referring now to FIG. 3, a clock/control signal distribution scheme is depicted in accordance with an embodiment of the present invention. A processor 40 is an example of a type of integrated circuit to which the techniques of the present invention apply, but it should be understood that the illustrated technique applies generally to any dynamic logic circuit for which large-scale clock distribution must be employed. A global clock buffer 42 receives the clock signal for the dynamic logic from other internal circuits (typically the output of a phase-lock-loop oscillator circuit) and the clock is distributed on global clock distribution lines to multiple local clock buffers 46, 46A and 46B. Local clock buffers 46, 46A and 46B generate the reduced-swing clock signal for operating dynamic logic gates 48 according to the present invention.

A voltage regulator 46 can be implemented on-chip or an external voltage $V_{d2}$ can be brought in to supply the upper rail of a buffer (inverter formed by transistors P40 and N40) that generates the clock signal having a swing extending from 0V to $V_{d2}$, from a global clock signal having a swing extending to the full power supply $V_{dd}$ range. Note that the power supply $V_{dd}$ is supplied to local gates 48 so that only local clock buffers 44-44B use reduced voltage power supply rail $V_{d2}$.

While the invention has been particularly shown and described with reference to the preferred embodiment thereof, it will be understood by those skilled in the art that the foregoing and other changes in form, and details may be made therein without departing from the spirit and scope of the invention.

What is claimed is:

1. An integrated circuit comprising:
a plurality of dynamic logic circuits each having a clock input for controlling evaluation and pre-charging of a summing node and a plurality of logic inputs for determining whether or not to said evaluation in response to said clock changes a logical state of said summing node; and
a local clock buffer having a clock output connected to said clock input of each of said plurality of dynamic logic circuits, and wherein said local clock buffer includes a reduced-swing clock generator circuit having an output connected for generating a reduced-swing clock signal having an evaluate phase voltage state substantially differing from a voltage of a first power supply rail of said plurality of dynamic circuits and a pre-charge voltage state substantially equal to a voltage of a second power supply rail of said plurality of dynamic circuits.

2. The integrated circuit of claim 1, wherein said plurality of dynamic logical circuits are limited-switch dynamic logic circuits, wherein all clocked devices within the dynamic logical circuits are clocked by said clock signal such that all clock swings extend only between said evaluate phase voltage and said second power supply rail voltage.

3. The integrated circuit of claim 1, wherein said evaluate phase voltage differs from said first power supply rail voltage by twenty to forty-five percent of the difference between said first and second power supply rail voltages.

4. The integrated circuit of claim 3, wherein said evaluate phase voltage differs from said first power supply rail voltage by twenty-two to thirty-three percent of the difference between said first and second power supply rail voltages.

5. The integrated circuit of claim 1, wherein said reduced swing clock generator circuit comprises a buffer having an input for receiving a full-swing clock signal having a clock input for receiving a global clock having a voltage swing extending substantially between said first power supply rail and said second power supply rail.

6. The integrated circuit of claim 4, wherein said integrated circuit has three power supply rail inputs, a first power supply input connected to said first power supply rail voltage, a second power supply input connected to said second power supply rail voltage and a third power supply input connected to a power supply rail having a voltage substantially equal to said evaluate phase voltage of said clock signal, and wherein said buffer has a power supply rail connected to said third power supply input for switching said evaluate phase voltage onto said clock output during said evaluate phase.

7. The integrated circuit of claim 1, wherein said plurality of dynamic circuits each comprise:
a first inverter having an input connected to said summing node; and
a second inverter having an input connected to an output of said first inverter and an output for providing an output of a corresponding one of said dynamic logic gates, and wherein said first inverter includes an inverter foot device for isolating said first inverter from said second power supply rail during said pre-charge phase of said clock, and wherein said inverter foot device is enabled during said evaluation phase of said clock with said evaluate phase voltage.

8. The integrated circuit of claim 1, wherein said plurality of dynamic circuits each comprise:
a first inverter having an input connected to said summing node;
a second inverter having an input connected to an output of said first inverter and an output for providing an output of a corresponding one of said dynamic logic gates; and
a keeper circuit for holding a state of said output of said first inverter when said clock signal is in said pre-charge phase, and wherein said keeper has a disable device having an input connected to said clock signal for disabling said keeper during said evaluate phase of said clock, and wherein said disable device is disabled during said evaluation phase of said clock with said evaluate phase voltage.

9. An integrated circuit comprising:
a plurality of dynamic logic circuits each having
a dynamic logic tree for discharging a summing node in response to predetermined states of one or more logical input signals connected to inputs of said dynamic logic tree,
at least one input foot device having a gate connected to said clock signal for isolating said dynamic logic tree from said second power supply rail during said pre-charge phase,
a first inverter having an input connected to said summing node and including an inverter foot device for isolating said first inverter from said second power supply rail during said pre-charge phase, a second inverter having an input connected to an output of said first inverter and an output for providing an output of said dynamic logic gates, and a keeper circuit for holding a state said output of said first inverter when said clock signal is in said pre-charge phase, and wherein said keeper has a disable device having an input connected to said clock signal for disabling said keeper during said evaluate phase of said clock, and wherein said disable device is disabled during said evaluation phase of said clock with said evaluate phase voltage; and a local clock buffer having a clock output connected to said clock input of each of said plurality of dynamic logic circuits, and wherein said local clock buffer includes a reduced-swing clock generator circuit having an output connected for generating a reduced-swing clock signal having an evaluate phase voltage state substantially differing from a voltage of a first power supply rail of said plurality of dynamic circuits and a pre-charge voltage state substantially equal to a voltage of a second power supply rail of said plurality of dynamic circuits.

10. The integrated circuit of claim 9, wherein said evaluate phase voltage differs from said first power supply rail voltage by twenty to forty-five percent of the difference between said first and second power supply rail voltages.

11. The integrated circuit of claim 10, wherein said evaluate phase voltage differs from said first power supply rail voltage by twenty-two to thirty-three percent of the difference between said first and second power supply rail voltages.

* * * * *